(12) United States Patent
Kim et al.

(10) Patent No.: US 11,527,880 B2
(45) Date of Patent: Dec. 13, 2022

(54) DOUBLE INCOMING BREAKER SYSTEM FOR POWER SYSTEM OF POWER PLANT

(71) Applicant: KOREA HYDRO & NUCLEAR POWER CO., LTD., Gyeongju-si (KR)

(72) Inventors: Yun-Ho Kim, Daejeon (KR); Han-Sang Kim, Daejeon (KR); Che-Wung Ha, Daejeon (KR)

(73) Assignee: KOREA HYDRO & NUCLEAR POWER CO., LTD., Gyeongju-si (KR)

( * ) Notice: Subject to any disclaimer, the term of this patent is extended or adjusted under 35 U.S.C. 154(b) by 300 days.

(21) Appl. No.: 16/644,234

(22) PCT Filed: Aug. 31, 2018

(86) PCT No.: PCT/KR2018/010181
§ 371 (c)(1),
(2) Date: Mar. 4, 2020

(87) PCT Pub. No.: WO2019/050229
PCT Pub. Date: Mar. 14, 2019

(65) Prior Publication Data
US 2021/0075208 A1    Mar. 11, 2021

(30) Foreign Application Priority Data

Sep. 5, 2017    (KR) .................. 10-2017-0113364

(51) Int. Cl.
*H02H 3/06*    (2006.01)
*H02H 3/05*    (2006.01)
(Continued)

(52) U.S. Cl.
CPC .................. *H02H 3/05* (2013.01); *G21D 3/06* (2013.01); *H02H 7/04* (2013.01)

(58) Field of Classification Search
CPC .. H03H 3/05; H02H 7/04; H02H 3/05; G21D 3/06
See application file for complete search history.

(56) References Cited

U.S. PATENT DOCUMENTS 2,385,219 A    9/1945  McConnell
5,157,575 A    10/1992 Feltis et al.
(Continued)

FOREIGN PATENT DOCUMENTS

CN    101238536    8/2008
CN    103389460    11/2013
(Continued)

OTHER PUBLICATIONS

SIPO, Office Action of CN 201880057693.4 dated Jul. 27, 2021.
(Continued)

*Primary Examiner* — Scott Bauer
(74) *Attorney, Agent, or Firm* — Lex IP Meister, PLLC

(57) ABSTRACT

The present invention is applied to a power system of a power plant including a three-winding transformer, and relates to a double incoming breaker system, including: a plurality of main circuit breakers respectively connected one by one to the plurality of first non-safety class high voltage buses and the plurality of second non-safety class high voltage buses; a plurality of auxiliary circuit breakers, one of which is connected in series to one of the plurality of main circuit breakers; a first power source measurer installed to correspond to the main circuit breaker and measuring a power source level of a non-safety class high voltage bus applied to the main circuit breaker; a second power source measurer installed to correspond to the auxiliary circuit breaker and measuring a power source level at an installed first point thereof; and a controller that outputs a first open signal to the main circuit breaker when an abnormal situation of the non-safety class high voltage bus is checked (Continued)

through the power source level measured by the first power source measurer, and outputs a second open signal to the auxiliary circuit breaker when it is determined that the main circuit breaker fails through the power source level at the first point measured by the second power source measurer after outputting the first open signal.

9 Claims, 7 Drawing Sheets

(51) Int. Cl.
*G21D 3/06* (2006.01)
*H02H 7/04* (2006.01)

(56) References Cited

U.S. PATENT DOCUMENTS

| | | | |
|---|---|---|---|
| 5,295,035 | A | 3/1994 | Nishijima et al. |
| 6,434,715 | B1 | 8/2002 | Andersen |
| 7,193,338 | B2 | 3/2007 | Ghali |
| 2002/0075620 | A1* | 6/2002 | Fischer ............... H02J 1/14 361/93.9 |
| 2003/0063419 | A1 | 4/2003 | Nemir |
| 2009/0040667 | A1* | 2/2009 | DiSALVO ............ H02H 3/335 361/42 |
| 2009/0212975 | A1* | 8/2009 | Ausman ............ G01R 31/3277 340/945 |
| 2010/0039741 | A1 | 2/2010 | Booth et al. |

FOREIGN PATENT DOCUMENTS

| | | |
|---|---|---|
| CN | 103746331 | 4/2014 |
| CN | 104756339 | 7/2015 |
| DE | 4235547 | 4/1993 |
| EP | 2720051 | 4/2014 |
| GB | 2537705 | 10/2016 |
| JP | 62-071896 | 4/1987 |
| JP | 04-112626 | 4/1992 |
| JP | 04-253000 | 9/1992 |
| JP | 1994-105438 | 4/1994 |
| JP | 1994-233459 | 8/1994 |
| JP | 08149717 | 6/1996 |
| JP | 1997-0009495 | 1/1997 |
| JP | 10304566 | 11/1998 |
| JP | 11-046438 | 2/1999 |
| JP | 2010182069 | 8/2010 |
| JP | 4878912 | 2/2012 |
| JP | 2015-126540 | 7/2015 |
| KR | 0681485 | 2/2007 |
| KR | 10-0972008 | 1/2010 |
| KR | 10-0991493 | 11/2010 |
| KR | 0991493 | 11/2010 |
| KR | 10-1084058 | 9/2011 |
| KR | 10-1223670 | 1/2013 |
| PL | 338727 | 11/2000 |
| WO | 1999-010958 | 3/1999 |

OTHER PUBLICATIONS

EPO, Search Report of EP 18854423.3 dated May 26, 2021.
EPO, Communication pursuant to Rules 70(2) and 70a(2) EPC of EP 18854423.3 dated Jun. 15, 2021.

* cited by examiner

DOUBLE INCOMING BREAKER SYSTEM FOR POWER SYSTEM OF POWER PLANT

TECHNICAL FIELD

The present disclosure relates to a double incoming breaker system applied to a power system of a power plant.

BACKGROUND ART

FIG. 1 illustrates an example of an on-site power system of a conventional power plant. FIG. 1 illustrates an exemplary view of an on-site power system of a typical power plant. Referring to FIG. 1, the on-site power system of the conventional power plant is supplied with power through a bus connected to a generator 10 of the power plant. When the power plant is stopped due to fuel replacement or the like such that power is not supplied from the generator 10, one of switch yards 21 and 22 respectively connected to two independent transmission lines is operated, and the on-site power system of the conventional power plant is supplied with off-site power through the operated switch yard (one of 21 and 22).

The on-site power supplied from the generator 10 and the off-site power supplied through the switch yard 21 and a main transformer 31, which is an auto transformer, are supplied to a primary winding of a first three-winding transformer 41 through a main bus 11, and the off-site power supplied through the switch yard 22 is supplied to a primary winding of a second three-winding transformer 42. A plurality of non-safety class high voltage buses are connected to a secondary side first winding (a) of each of the first three-winding transformer 41 and the second three-winding transformer 42, and a plurality of non-safety class high voltage buses and a plurality of safety class high voltage buses are connected to each of the secondary side second windings (b) thereof.

In addition, the non-safety class high voltage buses are coupled to non-safety class facilities 51 and 52, and the safety class high voltage buses are coupled with safety class facilities 53. The non-safety class facilities 51 and 52 are supplied with power through the non-safety class high voltage bus, and the safety class facilities 53 are supplied with power through the safety class high voltage bus. Here, the non-safety class facilities 51 and 52 are facilities of low importance, for example, lamps, etc., which do not always need to be continuously supplied with power, and the safety class facilities are facilities of high importance, for example, pumps, etc., which should be continuously supplied with power.

One non-safety class facility is coupled to one non-safety class high voltage bus connected to the first three-winding transformer 41 and one non-safety class high voltage bus connected to the second three-winding transformer 42 to be supplied with power from one of the first and second three-winding transformers 41 and 42. The safety class facilities 53 are also coupled to one safety class high voltage bus connected to the first three-winding transformer 41 and one safety class high voltage bus connected to the second three-winding transformer 42 to be supplied with power from one of the first and second three-winding transformers 41 and 42.

In order to prevent abnormal situations such as failures occurring in the non-safety class high voltage bus from being spread to the safety class high voltage bus, one incoming breaker 60 is installed at each non-safety class high voltage bus in the on-site power system of the power plant.

However, when a failure occurs in the non-safety class high voltage bus, if the incoming breaker 60 does not normally operate, the incoming breaker 60 continues to be in a closed state, causing a problem that adversely affects the safety class high voltage bus.

As a method of solving this problem, there is a method of using an auto transformer instead of a three-winding transformer so that the non-safety class high voltage bus and the safety class high voltage bus are independently separated. However, in order to replace the three-winding transformer with the auto transformer, since at least two auto transformers corresponding to one three-winding transformer are required, a considerable cost is consumed. In addition, since a space to accommodate the increased number of transformers in current facilities is lacking, it is difficult to install the increased number of transformers in the current facilities.

DISCLOSURE

Technical Problem

The present invention has been made in an effort to solve the above-mentioned problem and other problems. Another object of the present invention is to provide a double incoming breaker system for a power system of a power plant that may prevent an abnormal situation occurring in a non-safety class high voltage bus from affecting a safety class high voltage bus while using a three-winding transformer in an on-site power system of a power plant.

Another object of the present invention is to provide a double incoming breaker system for a power system of a power plant that may use a three-winding transformer and greatly reduce a risk that an abnormal situation occurring in a non-safety class high voltage bus may spread to a safety class high voltage bus.

Technical Solution

A double incoming breaker system for a power system of a power plant according to an embodiment of the present invention is applied to a power system of a power plant including a three-winding transformer of which a primary winding is coupled to an output side of a generator or to a switch yard, of which a first secondary winding is coupled to each non-safety class facility through a plurality of first non-safety class high voltage buses, of which a second secondary winding is coupled to each non-safety class facility through a plurality of second non-safety class high voltage buses, and of which the second secondary winding is coupled to each safety class facility through a plurality of safety class high voltage buses, and it includes: a plurality of main circuit breakers respectively connected one by one to the plurality of first non-safety class high voltage buses and the plurality of second non-safety class high voltage buses; a plurality of auxiliary circuit breakers, one of which is connected in series to one of the plurality of main circuit breakers; a first power source measurer installed to correspond to the main circuit breaker and measuring a power source level of a non-safety class high voltage bus applied to the main circuit breaker; a second power source measurer installed to correspond to the auxiliary circuit breaker and measuring a power source level at an installed first point thereof; and a controller that outputs a first open signal to the main circuit breaker when an abnormal situation of the non-safety class high voltage bus is checked through the power source level measured by the first power source measurer, and outputs a second open signal to the auxiliary circuit breaker when it is determined that the main circuit breaker fails through the power source level at the first point measured by the second power source measurer after outputting the first open signal.

A double incoming breaker system for a power system of a power plant according to another embodiment of the present invention is applied to a power system of a power plant including a three-winding transformer of which a primary winding is coupled to an output side of a generator or to a switch yard, of which a first secondary winding is coupled to each non-safety class facility through a plurality of first non-safety class high voltage buses, of which a second secondary winding is coupled to each non-safety class facility through a plurality of second non-safety class high voltage buses, and of which the second secondary winding is coupled to each safety class facility through a plurality of safety class high voltage buses, and it includes: a plurality of main circuit breakers respectively connected one by one to the plurality of first non-safety class high voltage buses and the plurality of second non-safety class high voltage buses; a plurality of auxiliary circuit breakers, one of which is connected in series to one of the plurality of main circuit breakers; a relay that measures a power source level of the main circuit breaker and opens or closes the main circuit breaker according to the measured power source level of the main circuit breaker; a power source measurer installed to correspond to the auxiliary circuit breaker and measuring a power source level at an installed first point thereof; and a controller that checks abnormal occurrence of a corresponding non-safety class high voltage bus through a power source level received from the power source measurer, and outputs an open signal to the auxiliary circuit breaker when the main circuit breaker determines that the main circuit breaker has failed through the power source level at the first point measured by the power source measurer after a set time from a time point of the abnormal occurrence.

The power source level at the first point is a power source level applied to the auxiliary circuit breaker, a power source level flowing in the main circuit breaker, or a power source level applied to a corresponding non-safety class facility.

The main circuit breaker is one of the first and second circuit breakers connected in series to a non-safety class high voltage bus, and the auxiliary circuit breaker is the other of the first and second circuit breakers.

Advantageous Effects

Effects of the double incoming breaker system for the power system of the power plant power according to the present invention are as follows.

According to at least one of the embodiments of the present invention, even though an abnormal situation occurs in the non-safety class high voltage bus, there is an effect that the safety class high voltage bus is not affected.

An additional range of applicability of the present invention will become clear from the following detailed description. However, since various modifications and alternations within the spirit and scope of the present invention may be clearly understood by those skilled in the art, it is to be understood that a detailed description and a specific exemplary embodiment of the present invention, such as an exemplary embodiment of the present invention, are provided only by way of example.

MODE FOR INVENTION

Figure 1:
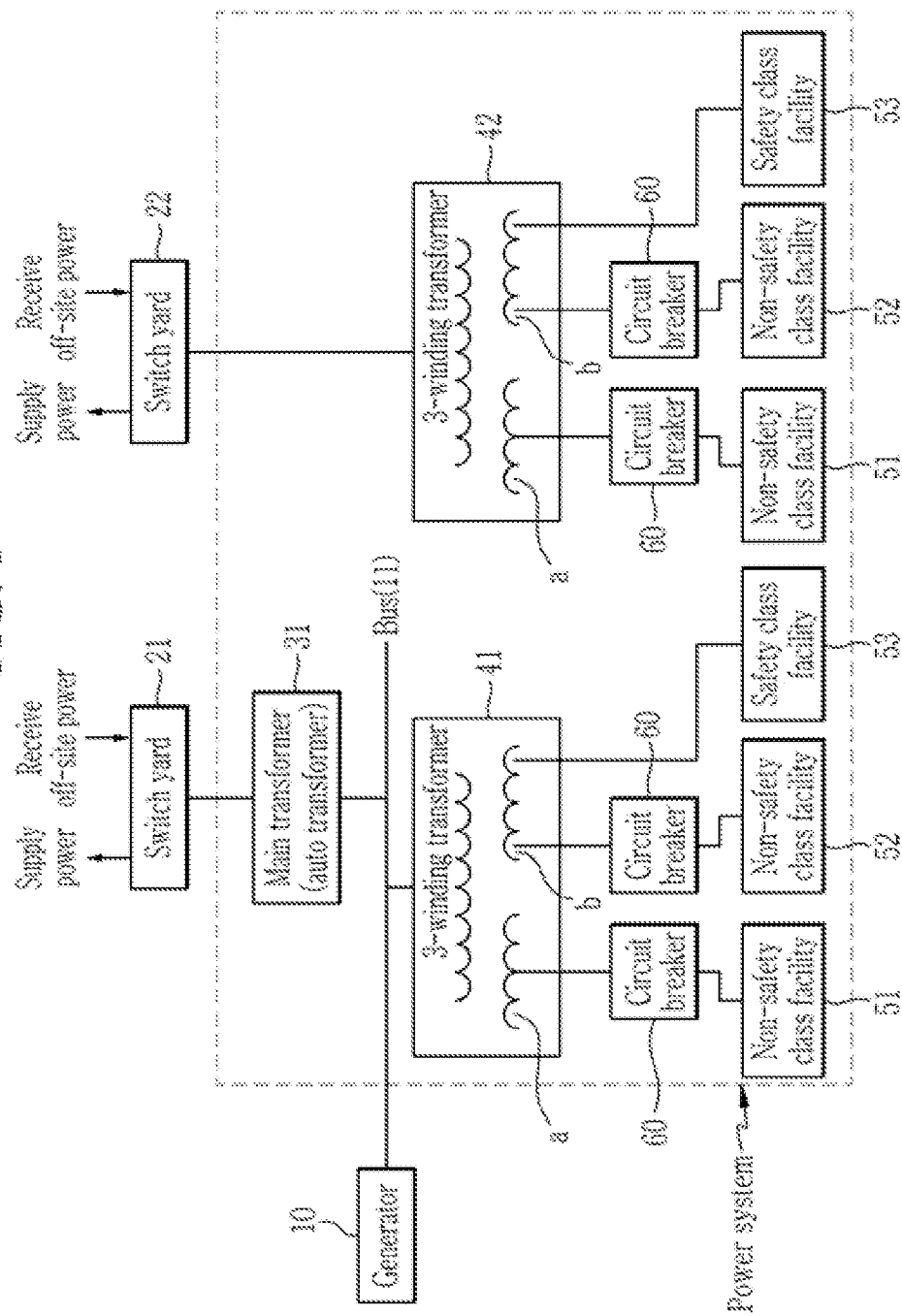
FIG. 1 illustrates an exemplary view of an on-site power system of a typical power plant.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive, and like reference numerals designate like elements throughout the specification. In addition, the detailed description of widely known technologies will be omitted.

In the present specification, unless explicitly described to the contrary, the word "comprise" and variations such as "comprises" or "comprising" will be understood to imply the inclusion of stated elements but not the exclusion of any other elements. In addition, the terms "-er", "-or", "unit", "portion", "part", and "module" described in the specification mean units for processing at least one function and operation, and can be implemented by hardware components or software components and combinations thereof.

Hereinafter, a double incoming breaker system for a power system of a power plant according to an embodiment of the present invention will be described with reference to the accompanying drawings.

Figure 2:
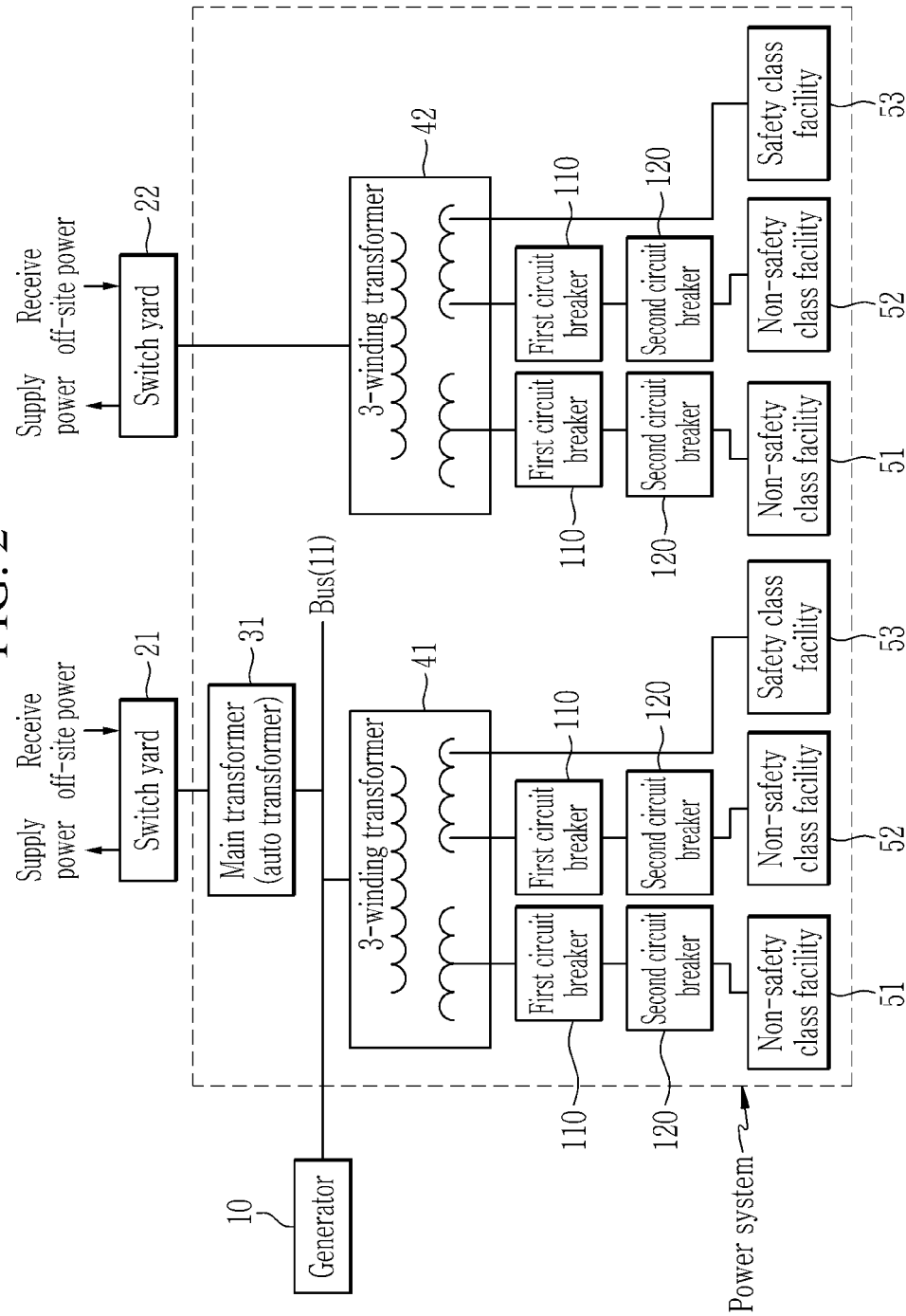
FIG. 2 illustrates a installation state of a breaker in a double incoming breaker system for a power system of a power plant according to an embodiment of the present invention.

FIG. 2 illustrates a installation state of a breaker in a double incoming breaker system for a power system of a power plant according to an embodiment of the present invention. The double incoming breaker system according to the embodiment of the present invention is applied to a power system that supplies power to each facility through three-winding transformers 41 and 42. For better understanding and ease of description, FIG. 2 illustrates a case in which the double incoming breaker system according to the embodiment of the present invention is applied to the power system of the conventional power plant described with reference to FIG. 1.

Referring to FIG. 2, the double incoming breaker system according to the embodiment of the present invention includes two breakers 110 and 120 connected in series to respective non-safety class high voltage buses coupling the secondary windings of the three-winding transformers 41 and 42 to the non-safety class facilities, that is, a first circuit breaker 110 and a second circuit breaker 120.

Here, one end (input terminal) of the first circuit breaker 110 is connected to the three-winding transformers 41 and 42, respectively, and the other end (output terminal) thereof is connected to the second circuit breaker 120. In addition, one end (input terminal) of the second circuit breaker 120 is connected to the other end of the first circuit breaker 110, and the other end (output terminal) thereof is connected to a facility or a high voltage panel board.

As such, one of the first and second circuit breakers 110 and 120 connected in series (hereinafter referred to as a "main circuit breaker") is normally kept closed, but when an abnormal situation such as an overcurrent and an overvoltage occur in a non-safety class high voltage bus, a switching operation, that is, an open operation of the switch, blocks power from being supplied to the non-safety class facility through the non-safety class high voltage bus in which the abnormal situation occurs, and also blocks an influence on the safety class high voltage bus. Then, the main circuit breaker is closed again when the abnormal situation (for example, a failure) of the non-safety class high voltage bus is cleared. Therefore, the main circuit breaker normally performs on/off (closed/opened) switching operations depending on whether an abnormal situation of the non-safety class high voltage bus is occurring.

In addition, the other of the first and second circuit breakers 110 and 120 (hereinafter referred to as an "auxiliary circuit breaker") is normally closed, but when the main circuit breaker does not normally operate, for example, when the main circuit breaker fails, the auxiliary circuit breaker operates instead of the main circuit breaker, that is, the auxiliary circuit breaker is opened to cope with the abnormal situation of the non-safety class high voltage bus. The auxiliary circuit breaker is switched to the closed state when the failure of the main circuit breaker is cleared.

Therefore, when the first circuit breaker 110 is used as the main circuit breaker, the second circuit breaker 120 is used as the auxiliary circuit breaker. As another example, when the second circuit breaker 120 is used as the main circuit breaker, the first circuit breaker 110 is used as the auxiliary circuit breaker.

Figure 3:
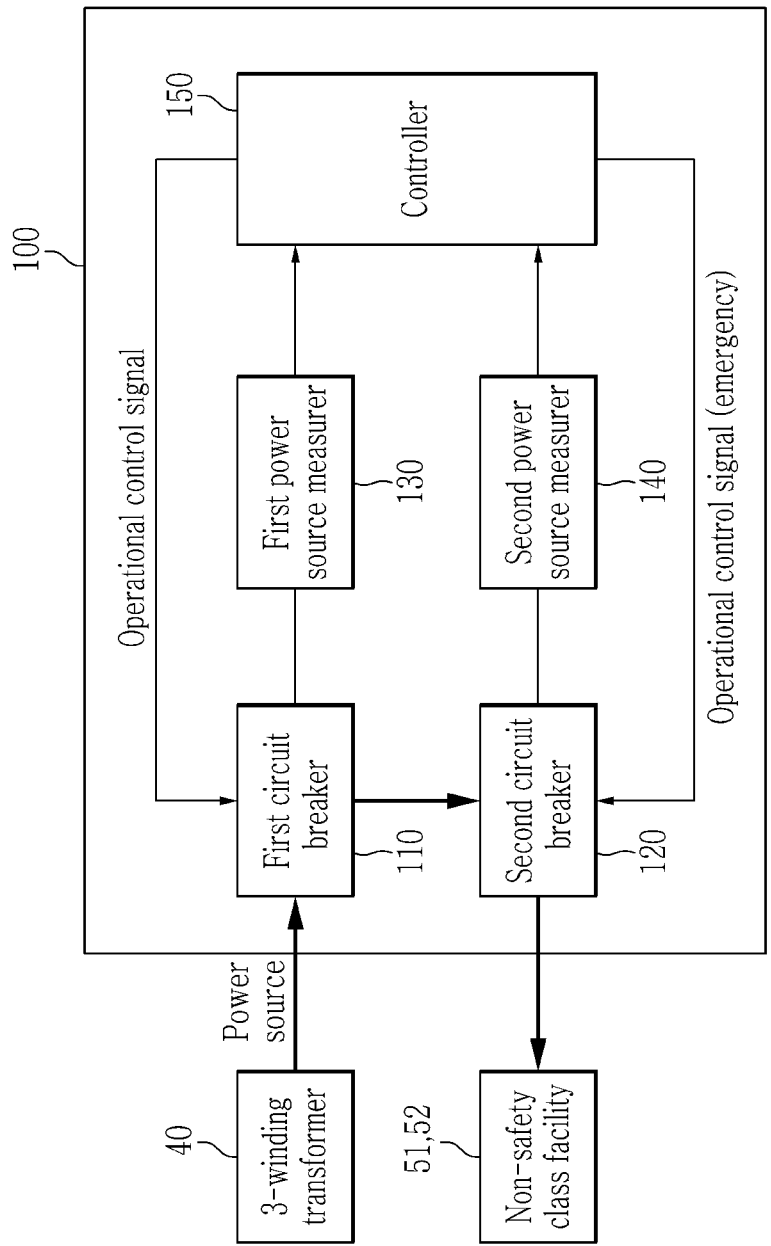
FIG. 3 illustrates a block diagram of a double incoming breaker system according to a first embodiment of the present invention.

FIG. 3 illustrates a block diagram of a double incoming breaker system according to a first embodiment of the present invention. FIG. 3 illustrates a configuration based on two breakers installed at one non-safety class high voltage bus connected to a secondary winding of a three-winding transformer 40. Here, the three-winding transformer 40 collectively refers to the three-winding transformers 41 and 42.

Referring to FIG. 3, the double incoming breaker system 100 according to the first embodiment of the present invention includes the first and second circuit breakers 110 and 120, first and second power measurers 130 and 140, and a controller 150.

The first and second circuit breakers 110 and 120 are installed to be connected in series to respective non-safety class high voltage buses connected to the secondary winding of the three-winding transformer 40. For example, in a case in which the number of the non-safety class high-voltage buses connected to the secondary winding of one three-winding transformer 40 is 10, each of the first and second circuit breakers 110 and 120 consists of ten. In addition, where the total number of three-winding transformers 40 installed in the power system is six and the number of the non-safety class high voltage buses connected to the secondary winding of each three-winding transformer 40 is ten, each of the first and second circuit breakers 110 and 120 consists of sixty. One of the first and second circuit breakers 110 and 120 operates as a main circuit breaker, and the other thereof operates as an auxiliary circuit breaker.

The first and second power measurers 130 and 140 are installed to correspond to the breakers 110 and 120, respectively, and measure a power state at the installed point, that is, a voltage level, a current level, or a voltage and current level, to provide them to the controller 150. Among the first and second power measurers 130 and 140, a power measurer installed to correspond to the main circuit breaker is installed to check whether a corresponding non-safety class high voltage bus is in an abnormal situation. On/off (opened/closed) states of the main circuit breaker are determined according to a measurement result of the power measurer installed to correspond to the main circuit breaker. The power measurer installed to correspond to the auxiliary circuit breaker is installed to check whether the main circuit breaker operates, and the on/off (opened/closed) states of the auxiliary circuit breaker are determined according to a measurement result of the power measurer installed to correspond to the auxiliary circuit breaker.

For example, the power measurer installed to correspond to the main circuit breaker measures power applied to the main circuit breaker, and the power measurer installed to correspond to the auxiliary circuit breaker measures a power source applied to the auxiliary circuit breaker, a power source flowing in the main circuit breaker, or a power source applied to the high voltage panel board.

In this case, it is necessary to consider that when the first circuit breaker 110 of the first and second circuit breakers 110 and 120 connected to the three-winding transformer is the main circuit breaker, a power source level applied to the second circuit breaker 120 according to the on/off operations of the first circuit breaker is changed, but when the second circuit breaker 120 connected to an output terminal of the first circuit breaker 110 is the main circuit breaker, a power source level applied to the first circuit breaker 120 is independent of the on/off operations of the second circuit breaker 120. Therefore, depending on which of the first and second circuit breakers 110 and 120 operates as the main circuit breaker, installation positions of the respective power measurers 130 and 140 are different.

The controller 150 is set to determine which of the first and second circuit breakers 110 and 120 is going to operate as the main circuit breaker. The controller 150 checks whether an abnormal situation such as a failure has occurred in a corresponding non-safety class high voltage bus through power states received through the first and second power measurers 130 and 140, and when it is determined that the abnormal situation has occurred, the controller 150 outputs an operation control signal for opening the main circuit breaker. When the power of the main circuit breaker is abnormal after the command for opening the main circuit breaker, the controller 150 outputs an operation control signal so that the auxiliary circuit breaker is opened. Here, a user can set which breaker operates as the main circuit breaker arbitrarily and at any time.

Figure 4:
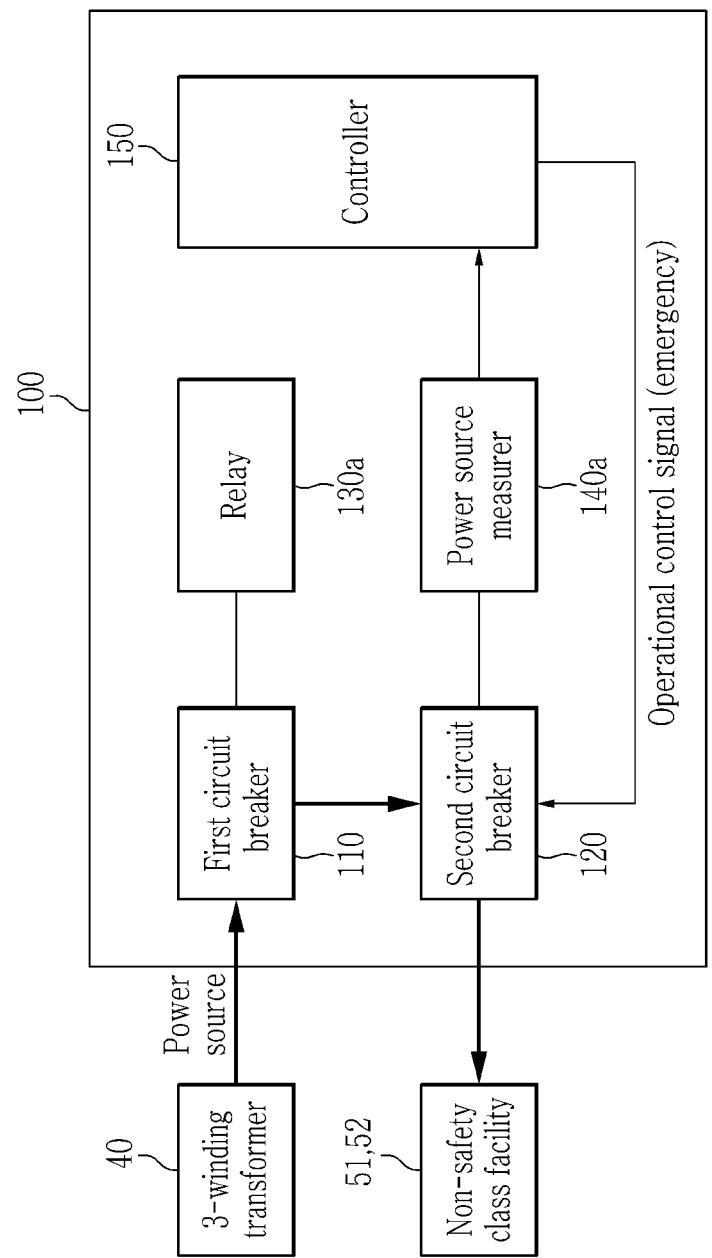
FIG. 4 illustrates a block diagram of a double incoming breaker system according to a second embodiment of the present invention.

FIG. 4 illustrates a block diagram of a double incoming breaker system according to a second embodiment of the present invention. FIG. 4 illustrates a configuration based on two breakers installed at one non-safety class high voltage bus connected to the secondary winding of the three-winding transformer 40.

Referring to FIG. 4, a double incoming breaker system 100 according to the second embodiment of the present invention includes the first and second circuit breakers 110 and 120, a relay 130a, a power source measurer 140a, and a controller 150a.

As described with reference to FIG. 3, the first and second circuit breakers 110 and 120 are installed to be connected in series to respective non-safety class high voltage buses connected to the secondary winding of the three-winding transformer 40.

The relay 130a is connected to the first circuit breaker 110 that operates as the main circuit breaker, and checks power (for example, voltage, current, or voltage and current) of the first circuit breaker 110, and when a voltage applied to or a power source flowing in the first circuit breaker 110 exceeds a set range, the relay 130a determines that an abnormal situation has occurred at a corresponding non-safety class high voltage bus and outputs a signal to open the first circuit breaker 110. The relay 130a outputs a signal to close the first circuit breaker 110 when the voltage applied to or the power source flowing in the first circuit breaker 110 returns to within a normal range (or the set range).

The power source measurer 140a is installed to correspond to the second circuit breaker 120 that operates as the auxiliary circuit breaker. The power source measurer 140a measures a voltage level, a current level, or a voltage and current level according to whether the main circuit breaker, that is, the first circuit breaker 110, operates, and provides the measured result to the controller 150a. An operation of the second circuit breaker 120 is determined according to the result measured by the power source measurer 140a.

The controller 150a determines whether an abnormal situation such as a failure occurs in a corresponding non-safety class high voltage bus through a power state received from the power source measurer 140a. When the controller 150a determines that the abnormal situation of the corresponding non-safety class high voltage bus continues to occur through the power state received from the power source measurer 140a even after the set time from a time point of occurrence of the abnormal situation, the controller 150a determines that the first circuit breaker 110 operating as the main circuit breaker has failed. The controller 150a then outputs an operation control signal for the second circuit breaker 120 to be opened.

Figure 5:
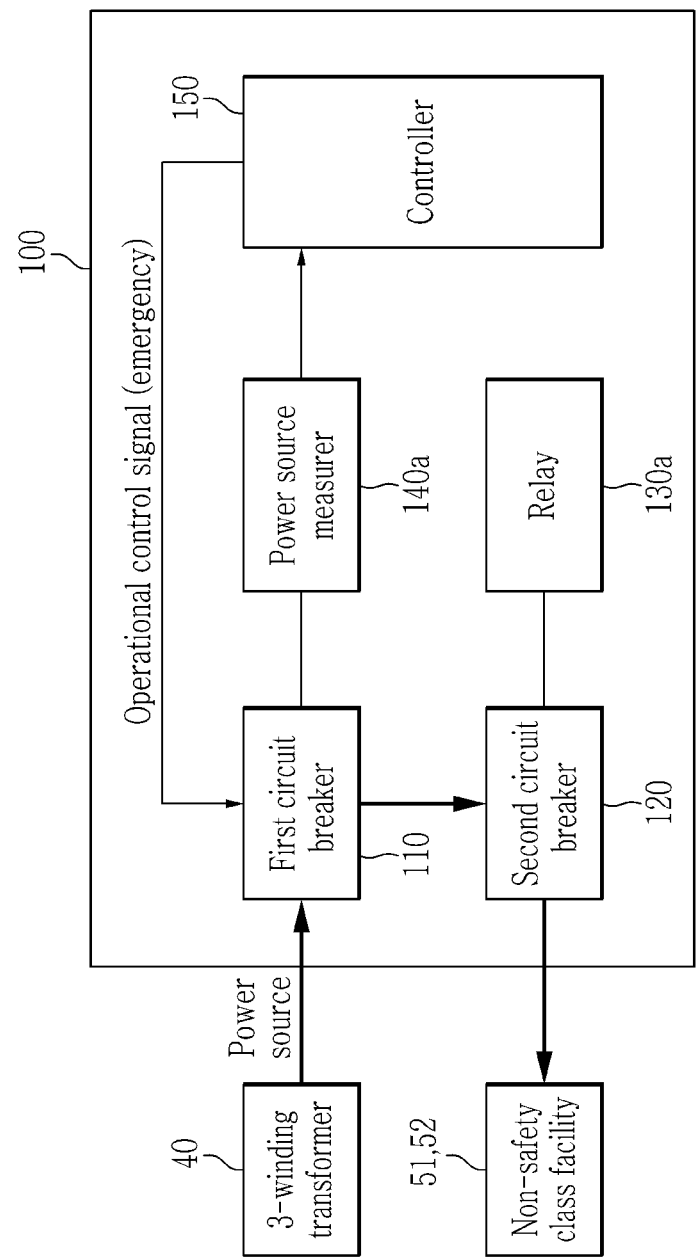
FIG. 5 illustrates a block diagram of a double incoming breaker system according to a third embodiment of the present invention.

FIG. 5 illustrates a block diagram of a double incoming breaker system according to a third embodiment of the present invention. As shown in FIG. 5, a double incoming breaker system 100 according to the third embodiment of the present invention has the same configuration as the second embodiment of the present invention. However, there is a difference in that the first circuit breaker 110 operates as the main circuit breaker in the second embodiment of the present invention, while the second circuit breaker 120 operates as the main circuit breaker in the third embodiment of the present invention.

Hereinafter, an operation of the double incoming breaker system 100 according to an embodiment of the present invention will be described with reference to FIG. 6

Figure 6:
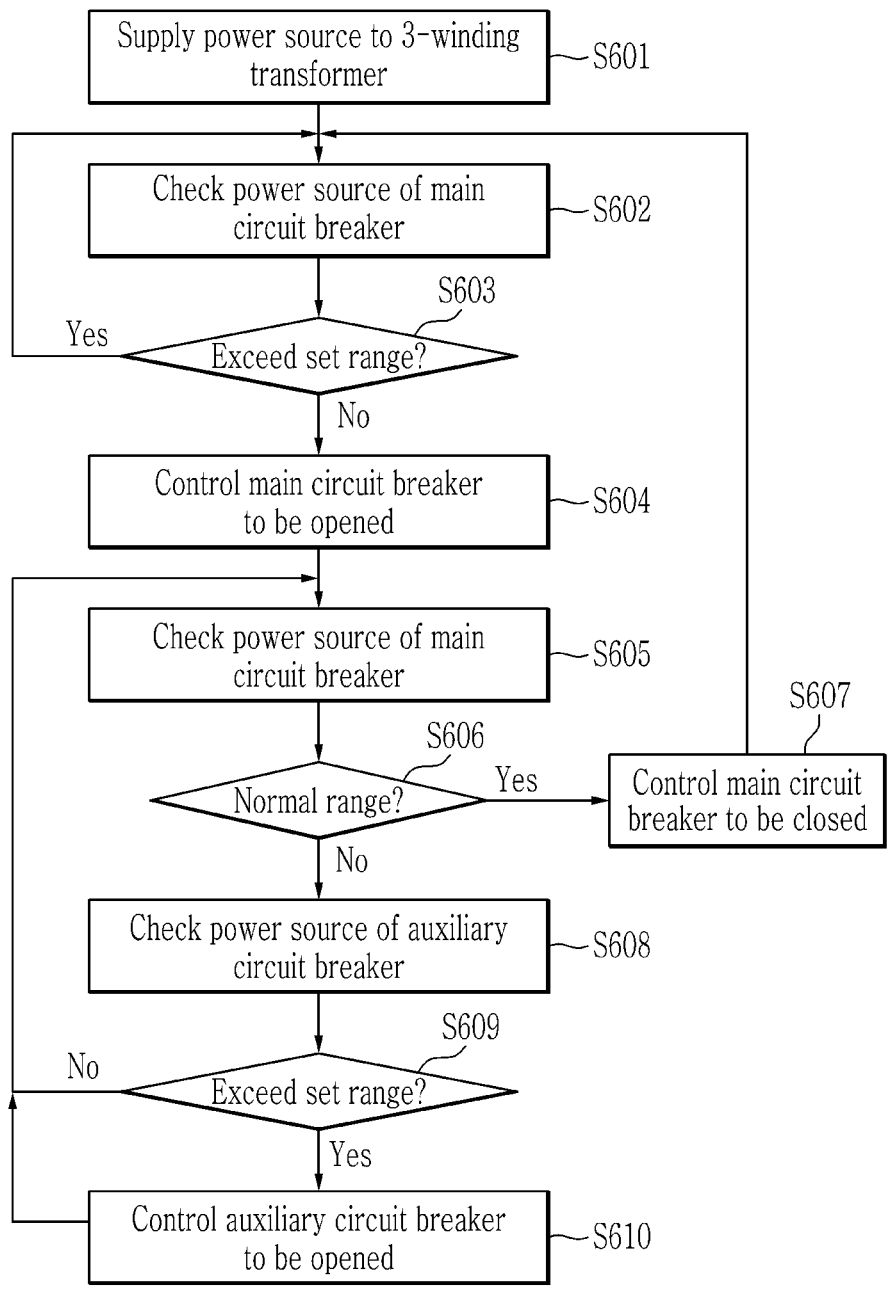
FIG. 6 illustrates a operational flowchart of a double incoming breaker system according to an embodiment of the present invention.

FIG. 6 illustrates an operational flowchart of a double incoming breaker system according to an embodiment of the present invention, which is an operational flowchart with respect to the double incoming breaker system according to the embodiment of the present invention.

Referring to FIG. 6, the three-winding transformer 40 is supplied with the on-site power of the generator 10 or the off-site power through the switch yard (one of 21 and 22), and the on-site power or the off-site power is transformed according to a turn ratio of the primary winding and the secondary winding of the three-winding transformer 40 to be provided to the non-safety class high voltage bus and the safety class high voltage bus, respectively (S601).

The power supplied to the non-safety class high voltage bus is provided to the non-safety class facility through the first circuit breaker 110 and the second circuit breaker 120. In this case, the power measurers 130 and 140 installed in correspondence with the first and second circuit breakers 110 and 120 measure the voltage applied to or the power flowing in the first and second circuit breakers 110 and 120 and provide the same to the controller 150.

The controller 150 checks a voltage applied to or the level of the power source (that is, the power value) flowing in the main circuit breaker among the first and second circuit breakers 110 and 120 through the power measured by the power source measurers 130 and 140 (S602), and determines whether the checked power source level has exceeded the set range by comparing the checked power source level with the set range (S603).

When the power source level of the main circuit breaker is within the set range, the controller 150 determines that the state of the high voltage bus is normal. Alternatively, when the power source level of the main circuit breaker exceeds the set range, the controller 150 determines that the high voltage bus is broken and outputs a control signal instructing opening to the main circuit breaker (S604). Here, the set range may be replaced with one set value.

The controller 150 outputs the control signal instructing the opening to the main circuit breaker, and then rechecks the power source level of the main circuit breaker through the corresponding power source measurer (S605), and checks whether the power source level of the main circuit breaker returns to the normal range (S606).

When the controller 150 determines that the power source level of the main circuit breaker has returned to the normal range at step S606, the controller 150 determines that the failure of the corresponding high voltage bus is cleared and outputs a control signal for closing the main circuit breaker (S607). Meanwhile, at step S606, when the power source level of the main circuit breaker continues to exceed the set range, the controller 150 checks the power source level measured by the power source measurer installed to correspond to the auxiliary circuit breaker (S608), and when the checked power source level is within the set range, the controller 150 determines that the main circuit breaker normally operates, while when the checked power source level exceeds the set range, the controller 150 determines that the main circuit breaker is broken and outputs a control signal for opening the auxiliary circuit breaker (S610).

Figure 7:
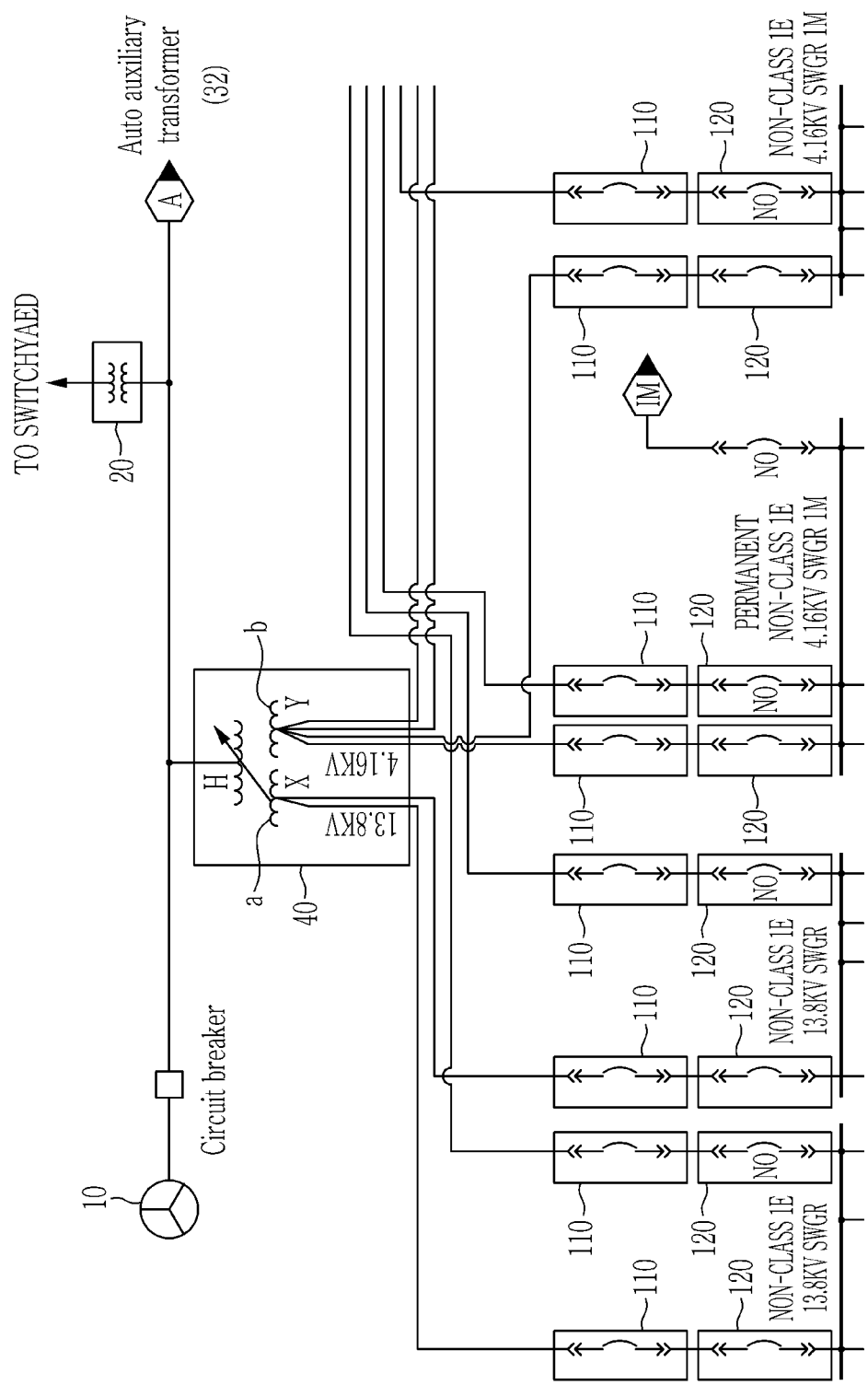
FIG. 7 illustrates a schematic view of a double incoming breaker system installed in a nuclear power plant according to an embodiment of the present invention.

FIG. 7 illustrates a schematic view of a double incoming breaker system installed in a nuclear power plant according to an embodiment of the present invention. Referring to FIG. 7, a plurality of 13.8 kV non-safety class high voltage buses are connected to the first winding 41 of the secondary side of the three-winding transformer 40, and a plurality of 4.16 kV non-safety class high voltage buses and a plurality of 4.16 kV safety class high voltage buses are connected to the second winding 42 of the secondary side thereof.

In addition, the first and second circuit breakers 110 and 120 connected in series are installed in each of the plurality of 13.8 kV non-safety class high voltage buses, and the first and second circuit breakers 110 and 120 connected in series are installed in each of the plurality of 4.16 kV non-safety class high voltage buses.

While this invention has been described in connection with what is presently considered to be practical exemplary

| | |
|---|---|
| 100: double incoming breaker system | |
| 110: first circuit breaker | |
| 120: second circuit breaker | 130: first power source measurer |
| 140: second power source measurer | 150, 150a: controller |
| 130a: relay | 140a: power source measurer |
| 10: generator | 21, 22: switch yard |
| 31: main transformer | 41, 42: three-winding transformer |
| 51, 52: non-safety class equipment | 53: safety-safe equipment |
| 60: conventional circuit breaker | |

The invention claimed is:

1. A double incoming breaker system for a power system of a power plant including a three-winding transformer of which a primary winding is coupled to an output side of a generator or to a switch yard, of which a first secondary winding is coupled to each of a plurality of non-safety class facilities through a plurality of first non-safety class high voltage buses, of which a second secondary winding is coupled to each of the non-safety class facilities through a plurality of second non-safety class high voltage buses, and of which the second secondary winding is coupled to each of a plurality of safety class facilities through a plurality of safety class high voltage buses, comprising:
   a plurality of main circuit breakers respectively connected one by one to the plurality of first non-safety class high voltage buses and the plurality of second non-safety class high voltage buses;
   a plurality of auxiliary circuit breakers, one of which is connected in series to one of the plurality of main circuit breakers;
   a first power source measurer installed to correspond to the main circuit breakers and measuring a power source level of the first and second non-safety class high voltage buses applied to the main circuit breakers;
   a second power source measurer installed to correspond to the auxiliary circuit breakers and measuring a power source level at an installed first point thereof; and
   a controller that outputs a first open signal to the main circuit breakers when an abnormal situation of the first and second non-safety class high voltage buses is determined through the power source level measured by the first power source measurer, and outputs a second open signal to the auxiliary circuit breakers when it is determined that the main circuit breakers fail through the power source level at the first point measured by the second power source measurer after outputting the first open signal.

2. The double incoming breaker system of claim 1, wherein the power source level at the first point is a power source level applied to the auxiliary circuit breakers, a power source level flowing in the main circuit breakers, or a power source level applied to a-corresponding one of the non-safety class facilities.

3. The double incoming breaker system of claim 1, wherein the main circuit breakers are one of first and second circuit breakers connected in series to the first and second non-safety class high voltage buses, and the auxiliary circuit breakers are the other of the first and second circuit breakers.

4. A double incoming breaker system for a power system of a power plant including a three-winding transformer of which a primary winding is coupled to an output side of a generator or to a switch yard, of which a first secondary winding is coupled to each of a plurality of non-safety class facilities through a plurality of first non-safety class high voltage buses, of which a second secondary winding is coupled to each of the non-safety class facilities through a plurality of second non-safety class high voltage buses, and of which the second secondary winding is coupled to each of a plurality of safety class facilities through a plurality of safety class high voltage buses, comprising:
   a plurality of main circuit breakers, each of a plurality of first non-safety class high voltage buses and each of a plurality of second non-safety class high voltage buses are connected in series to one of the main circuit breakers respectively;
   a plurality of auxiliary circuit breakers, one of which is connected in series to one of the main circuit breakers;
   a relay that measures a power source level of the main circuit breakers and opens or closes the main circuit breakers according to the measured power source level of the main circuit breakers;
   a power source measurer installed to correspond to the auxiliary circuit breakers and measuring a power source level at an installed first point thereof; and
   a controller that checks abnormal occurrence of corresponding one of the first and second non-safety class high voltage buses through a power source level received from the power source measurer, and outputs an open signal to the auxiliary circuit breakers when the main circuit breakers are determined to be failed through the power source level at the first point measured by the power source measurer after a set time from a time point of the abnormal occurrence.

5. The double incoming breaker system of claim 4, wherein the power source level at the first point is a power source level applied to the auxiliary circuit breakers, a power source level flowing in the main circuit breakers, or a power source level applied to corresponding one of the non-safety class facilities.

6. The double incoming breaker system of claim 4, wherein the main circuit breakers are one of first and second circuit breakers connected in series to the first and second non-safety class high voltage buses, and the auxiliary circuit breakers are the other of the first and second circuit breakers.

7. A method of controlling an incoming breaker, in an incoming breaker system that includes a plurality of main circuit breakers, each of a plurality of first non-safety class high voltage buses and each of a plurality of second non-safety class high voltage buses are connected in series to one of the plurality of main circuit breakers respectively, a plurality of auxiliary circuit breakers, one of which is connected in series to one of the plurality of main circuit breakers, a first power source measurer installed to correspond to the main circuit breakers and measuring a power source level of the first and second non-safety class high voltage buses applied to the main circuit breakers, a second power source measurer installed to correspond to the auxiliary circuit breakers and measuring a power source level at an installed first point thereof, and a controller, comprising:
   determining, by the controller, whether a power source level measured by the first power source measurer exceeds a set range;

outputting, by the controller, a first open signal to the main circuit breakers when the power source level measured by the first power source measurer exceeds the set range;

determining again, by the controller, whether the power source level measured by the first power source measurer exceeds the set range after the outputting of the first open signal; and outputting, by the controller, a second open signal to the auxiliary circuit breakers when the power source level measured by the first power source measurer exceeds the set range.

8. The method of controlling the incoming breaker of claim 7, further comprising, after the determining again, by the controller, whether the power source level measured by the first power source measurer exceeds the set range, outputting, by the controller, a first close signal closing the main circuit breakers when the power source level measured by the first power source measurer is within the set range.

9. The method of controlling the incoming breaker of claim 7, wherein the outputting, by the controller, the second open signal to the auxiliary circuit breakers when the power source level measured by the first power source measurer exceeds the set range, includes:

determining, by the controller, whether a power source level measured by the second power source measurer exceeds a set range; and outputting, by the controller, the second open signal to the auxiliary circuit breakers when the power source level measured by the second power source measurer exceeds the set range.

\* \* \* \* \*